United States Patent [19]

Iwasa

[11] Patent Number: 4,683,653

[45] Date of Patent: Aug. 4, 1987

[54] METHOD FOR PRODUCING A MULTILAYER PRINTED-CIRCUIT BOARD

[75] Inventor: Yamahiro Iwasa, Hachioji, Japan

[73] Assignee: Asahi Chemical Research Laboratory Co., Ltd., Japan

[21] Appl. No.: 806,450

[22] Filed: Dec. 9, 1985

[30] Foreign Application Priority Data

Dec. 31, 1984 [JP] Japan ................................ 59-278116

[51] Int. Cl.[4] .............................................. H05K 3/36
[52] U.S. Cl. ...................................... 29/830; 156/322
[58] Field of Search .................... 29/830, 846; 427/96, 427/97; 106/1.18; 156/322, 309.9

[56] References Cited

U.S. PATENT DOCUMENTS

| 2,600,343 | 6/1952 | Tuttle | 29/846 |
|---|---|---|---|
| 3,075,866 | 1/1963 | Baker et al. | 29/846 |
| 3,951,713 | 4/1976 | Emmel | 156/309.9 |
| 3,997,386 | 12/1976 | Oshida et al. | 156/309.9 |
| 4,258,468 | 3/1981 | Balde | 29/830 |
| 4,327,126 | 4/1982 | Ogden | 427/97 |
| 4,353,816 | 10/1982 | Iwasa | 106/1.18 |
| 4,391,742 | 7/1983 | Steigerwald et al. | 106/1.18 |
| 4,392,909 | 7/1983 | Bohn et al. | 156/306.9 |
| 4,457,861 | 7/1984 | Des Marais, Jr. | 106/1.18 |
| 4,549,043 | 10/1985 | Kalubowila et al. | 29/846 |
| 4,591,220 | 5/1986 | Impey | 29/830 |

FOREIGN PATENT DOCUMENTS 51-93394 8/1976 Japan .

Primary Examiner—Lowell A. Larson
Attorney, Agent, or Firm—Robert F. Ziems

[57] ABSTRACT

A method for producing a multilayer printed-circuit board is disclosed, the method substantially comprises the steps of: printing an electrically conductive paste on one or both sides of a predetermined number of electrically insulated prepreg base plates to form thereon electrically conductive circuits; drying the circuit processed base plates; laminating and pressing the circuit processed base plates into a single laminated board; making holes in the single laminated board, the holes being extended through in the direction of the thickness of the board; and applying an electrical conductor to the inner faces of the holes to make electrically conductive the laminated circuits to each other within the single laminated board.

2 Claims, 13 Drawing Figures

METHOD FOR PRODUCING A MULTILAYER PRINTED-CIRCUIT BOARD

BACKGROUND OF THE INVENTION

The invention relates to a method for producing a multilayer print-circuit board, and more particularly relates to the steps of forming electrically conductive circuits on one or both sides of a base plate and laminating a predetermined number of so processed base plates in a form of a single multilayer print-circuit board to be used in electric appliances.

With the recent wide spread of various electric appliances, multilayer print-circuit boards have been used in combination with these electronic appliances. So far, in order to produce a multilayer print-circuit board composed of a predetermined number of base plates laminated to each other and each having electrically conductive circuits on one or both sides thereof, it has been required to take the following steps: Pressing an electrolytic copper lamination on one or both sides of an electrically insulated base plate to secure the former to the latter; protecting the circuit portions with the oxidization-proof ink and making etchings with the ferric chloride and then melting away the copper lamination to leave the circuit portions; removing the oxidization-proof ink to expose the circuit portions, thus to provide the base plate having the electrically conductive circuits on one or both sides thereof; laminating a plurality of so processed base plates to provide a single multilayer circuit processed board having the inner laminated circuits; making holes extending through the single multilayer circuit processed board; and then processing the holes with an electrically conductive element such that the inner laminated circuits may be made electrically conductive to each other.

Therefore the conventional copper lamination etching method requires a considerable number of copper laminations to be secured to the base plates constituting the single multilayer circuit board with each, in turn, requiring multiple processing steps such as coating the circuit portions with the oxidization-proof ink, melting away the remaining portions of the copper lamination and removing the oxidization-proof ink. Moreover, considerable precision is required to laminate a number of so processed base plates into a single piece of multilayer circuit processed board. Actually it has been difficult in practice to laminate more than four pieces of base plates.

Besides the above mentioned base plates which are polymerized and processed generally at low temperature, it is generally known that a number of alumina base plates may be laminated into a single multi-layer circuit processed board. According to this method, the base plate is heated, for example, up to 1600° C. It is therefore required to employ the base plate made of a suitable material such as the ceramics which may bear such a high temperature of heat processing. Moreover it is rather difficult to make holes in such a hard lamination board. For this reason, so many electrodes have to be provided on the corners of the multilayer circuit processed board so as to make the laminated circuits electrically conductive to each other.

SUMMARY OF THE INVENTION

The present invention has been provided to eliminate the defects and disadvantages of the prior art. Accordingly it is an object of the invention to provide a unique method, in which an electrically conductive paste is used, instead of the conventional copper lamination and etching process, to form the circuits on one or both sides of a base plate, i.e., the paste is printed to one or both sides of a prepreg (preimpregnated) base plate in a manner as to form the circuits thereon and then is dried and subsequently a plurality of so processed base plates are laminated and pressed into a single multilayer circuit board which is finally processed into a finished multilayer print-circuit board, which is suited especially to the domestic or household electronic appliances. It is another object of the invention to use an electrically conductive copper paste which is excellent in electrical conductivity and may be heated up to approximately 150° C. while the copper particles are prevented from being oxidized with the aid of a specific additive of anthracene or the derivative thereof. In this method, the finished product is excellent in the electrical conductivity and may be produced at a cost far lower than in the case of using the other metal pastes such as an electrically conductive silver paste, etc.. It is another object of the invention to apply the electrolysis or nonelectrolysis galvanizing to the electrically conductive circuits of the copper paste to thereby obtain the same effect which may be obtained when a copper lamination used. It is still another object of the invention to provide a multilayer print-circuit board composed of more than four laminations of base plates which has been practically difficult to produce so as to be used in the domestic or household electronic appliances.

In short, the invention comprises the steps of: coating one or both sides of an electrically insulated prepreg base plate with an electrically conductive paste to form thereon electrically conductive circuits; drying the circuit processed base plate; laminating and pressing a plurality of so processed base plates to form a single multilayer circuit processed board; making holes in the single multilayer circuit processed board, the holes extending in the direction of the thickness of board; and then processing the holes with an electrically conductive element to form a series of circuits electrically conductive to each other within the laminated board. Another aspect of the invention comprises the steps of: printing one or both sides of an electrically insulated prepreg base plate with an electrically conductive paste in a manner as to form thereon electrically conductive circuits; galvanizing the electrically conductive circuits of the base plate with a specific electrically conductive material; drying the so processed base plate; laminating and pressing a plurality of so processed base plates to form a single multilayer printed board; making holes in the multilayer printed board, the holes extending in the direction of the thickness of the board; and then processing the holes with an electrically conductive material to form a series of circuits electrically conductive to each other within the laminated board.

The other features and advantages will be apparent from the following description of the invention in so reference to the preferred embodiments as shown in the accompanying drawings.

DETAILED DESCRIPTION OF THE INVENTION

Figure 1:
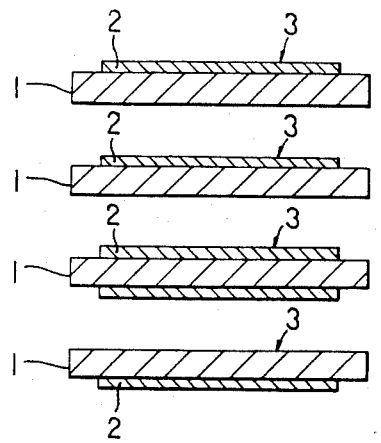
FIG. 1 is a exploded side elevational view of the laminations of electrically insulated base plates shown in vertical section each coated with an electrically conductive paste in accordance with the invention.

In reference to FIGS. 1 to 5, a predetermined number of electrically insulated plates 1 are prepreg base plates made of, for example, an epoxy resin. As shown in FIG. 1, the electrically insulated plates 1 have one or both sides thereof coated with an electrically conductive paste 2 in a printed fashion in a manner that electrically conductive circuits are formed on the plates 1. The electrically insulated prepreg plates 1 are made of a synthetic resin mixed with a reinforcing material and are more or less soft in an environment temperature. The electrically conductive paste 2 may be an electrically conductive silver paste, an electrically conductive carbon paste or an electrically conductive copper paste. Among these pastes, it is preferable to use the copper paste as disclosed in the U.S. Pat. No. 4,353,816 of the same applicant, because this is of a sufficient electric conductivity and may be available at a low cost. The copper paste includes 15-30 percent by weight of one type of resins mixed with 0.2-5 percent, preferably 0.23-1.6 percent by weight of a specific additive which is a selected one of the group of anthracene and the derivatives thereof. The additive may preferably be anthracene and anthracene carboxylic acid and may be secondarily anthradine and next may be anthranilic acid.

Figure 4:
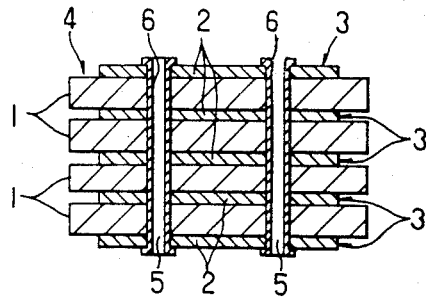
FIG. 4 is a side elevational view shown in vertical section of the single multilayer circuit processed board having the holes processed with an electrically conductive material.
Figure 5:
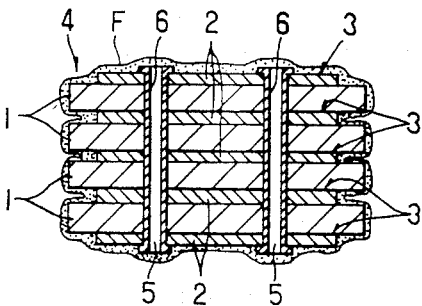
FIG. 5 is a side elevational view shown in vertical section of the single multilayer printed board of FIG. 4 having a flux coated all therearound.

In order to produce the 4-lamination layer print-circuit board 4 as shown in FIGS. 4 and 5, four electrically insulated prepreg plates 1 are employed as shown in FIG. 1. The first and second upper plates are printed with the electrically conductive paste 2 only on the upper face thereof. The third plate is printed with the paste on both sides thereof and the bottom plate is printed with the paste only on the lower face thereof. The thickness of the paste 2 is preferably about $10\mu$. Thus the electrically conductive circuits 3 are formed respectively on the plates 1, and then these plates are dried with a temperature of about 80° C. for about 30 minutes so as to be hardened. In this case, if the electrically conductive paste is mixed with silver or carbon powder instead of copper powder, there is no problem of oxidization in the paste. However, if the paste is mixed with copper powder, the copper powder will be oxidized to extremely deteriorate the electrical conductivity of the paste. Accordingly to the invention, the electrically conductive paste 2 of copper powder is prevented from being oxidized by a specific additive such as anthracene or the derivative thereof included in the paste. Therefore the specific paste 2 of copper powder will maintain sufficient electric conductivity after the heat processing and moreover the electric resistance of the conductive circuits 3 will practically have a same property as that of the electrically conductive circuits which are made up by the conventional copper lamination etching method.

Figure 2:
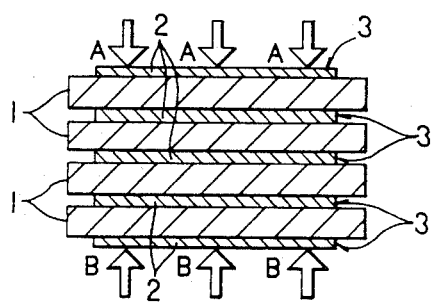
FIG. 2 is a side elevational view shown in vertical section of the laminations assembled and pressed to form a single multilayer printed board.

The electrically insulated prepreg plates 1 thus processed are subsequently laminated and pressed from the upper and bottom sides as indicated by arrow marks A and B as shown in FIG. 2 while the prepreg plates 1 are dried with a temperature of about 170° C. for about 30-60 minutes. With this process, the prepreg base plates 1 and the electrically conductive circuits 3 become more hardened and fixedly attached to each other into a single multilayer circuit processed board 4.

Figure 3:
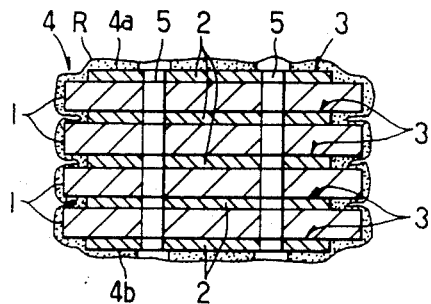
FIG. 3 is a side elevational view shown in vertical section of the single multilayer printed board having vertical holes processed therein.
Figure 6:
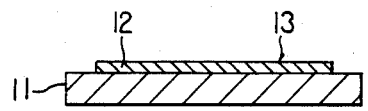
FIG. 6 is a side elevational view shown in vertical section of an electrically insulated base plate having an electrically conductive paste coated on one side thereof according to a second embodiment of the invention.

Subsequently as shown in FIG. 3, the multilayer circuit processed board 4 is processed with making holes 5 each extended through the board 4 in the direction of the thickness from the top 4a to the bottom 4b thereof to make the respective circuits 3 electrically conductive to each other. Then the board 4 is masked all over by means of a resist R except the holes 5 and the upper and lower peripheries thereof.

Subsequently as shown in FIG. 4, the inner faces of the holes 5 and the upper and lower peripheries thereof are processed with an electrical conductor 6 to make the circuits 3 electrically conductive to each other. The conductivity processing may be non-electrolytic plating or may be filting a suitable conductive material such as a silver paste or a copper paste. After the holes 5 have been made conductive in this way, the resist R is removed from the board 4.

Thus a single multilayer print-circuited board 4 is produced. Further in order to make the finished board 4 bear long preservation, a flux F is coated all over the board 4 as shown in FIG. 5. The flux F may be a resinous or imidazole flux.

As described above, the single multilayer printed-circuit board 4 of the invention is produced only by coating each insulated prepreg plate 1 with the electrically conductive paste 2 to form the electrically conductive circuit on each plate and then by laminating a predetermined number of so processed plates 1. It is therefore apparent, the multilayer printed board 4 may be more easily produced precluding the complicated processes as required in the conventional copper lamination etching method. The multilayer printed-circuit board 4 thus produced has a precision sufficient enough to be used in the domestic or household electronic appliances.

Now in reference to FIGS. 6 through 13 showing another embodiment of the invention, four base plates 11 are respectively processed into a 4-lamination layer printed-circuit board 14 as in the case of the first embodiment of the invention shown in FIGS. 1 through 5.

Figure 7:
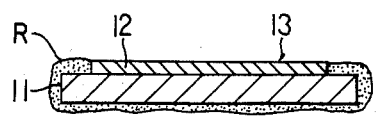
FIG. 7 is a side elevational view shown in vertical section of the electrically insulated base plate masked with the coat of a resist.
Figure 8:
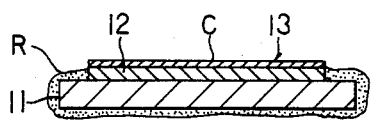
FIG. 8 is a side elevational view shown in vertical section of the so processed base plate having the electrically conductive circuits galvanized with copper.
Figure 9:
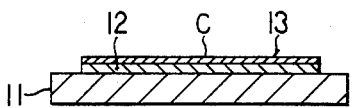
FIG. 9 is a side elevational view shown in vertical section of a circuit processed base plate with the resist removed from the condition of FIG. 8.

At first in reference to FIGS. 6 through 9 showing the processing of the uppermost base plate 11 of the 4-lamination layer printed-circuit board 14, an electrically conductive paste 12 is printed on the upper face of the electrically insulated prepreg base plate 11 with the approximate thickness 10μ of the paste to form an electrically conductive circuit 13 thereon, and then the processed base plate 11 is dried in the temperature of about 80° C. for about 30 minutes to harden the insulated base plate 11 and the paste 12. Subsequently as shown in FIG. 7, the insulated base plate 11 is masked with a resist R on all surfaces except the surface supporting the electrically conductive circuit 13. Subsequently, as shown in FIG. 8, the electrolytic or non-electrolytic copper plating is applied to the masked base plate 11, and then the layer C of about 5μ of electrolyzed copper is formed on the exposed circuit portion 13 of the base plate 11. In this case, the same layer of electrolyzed copper is formed on the electrically conductive copper paste 12. The electrolytic or nonelectrolytic copper plating is, however, not needed in case an electrically conductive silver or carbon paste is employed. Thus the processed base plate 11 is formed with the electrically conductive circuit 13 having the thickness of approximately 15μ due to the thickness 10μ of the circuit and the thickness 5μ of the electrolyzed copper plating C. Subsequently as shown in FIG. 9, the resist R is removed from the base plate 11, and thus the processing of the insulated base plate 11 is finished. The mentioned catalyst processing and the masking processing may be eliminated, if the electrically conductive paste 12 is exclusively plated.

The second insulated base plate 11 is processed to have a circuit 13 formed on the upper face thereof just in the same manner as the appermost insulated base plate 11 as mentioned above. The third insulated base plate 11 is processed to have circuits 13 formed on both faces thereof in the same manner, and then the fourth bottom plate 11 is processed to have a circuit 13 formed on the lower face thereof.

Figure 10:
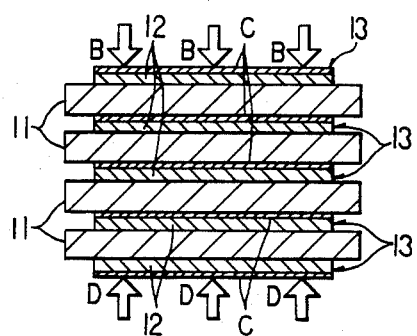
FIG. 10 as a side elevational view shown in vertical section of a plurality of the circuit processed base plates laminated and pressed into a single multilayer circuit processed board.

The four base plates 11 thus processed to have the circuits 13 respectively are then, as shown in FIG. 10, laminated and pressed from the top and bottom as indicated by arrow marks B and D while these base plates 11 are dried in the temperature of about 170° C. for about 30 to 60 minutes. As the result, the four processed base plates 11 are fixedly laminated into a hardened single multilayer circuit processed board 14.

Figure 11:
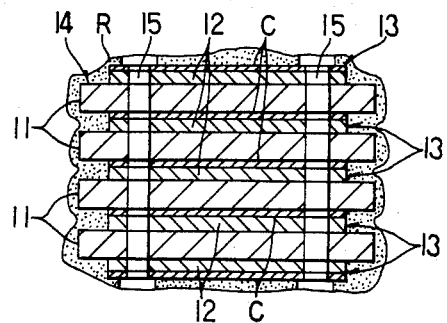
FIG. 11 is a side elevational view shown in vertical section of the single multilayer circuit processed board having holes processed therein.

Subsequently as shown in FIG. 11, the single multilayer circuit processed board 14 is put into a process of making holes 15 extended though in the direction thickness thereof to make electrically conductive the laminated circuits 13 to each other. Then the single multilayer circuit processed board is masked with the resist R except the inner faces of the holes 15 and the peripheries thereof on the upper and bottom sides of the board 14.

Figure 12:
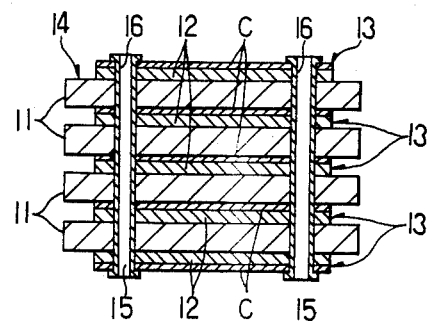
FIG. 12 is a side elevational view shown in vertical section of the single multilayer circuit processed board having the holes processed with an electrically conductive material to form a series of circuits electrically conductive to each other within the board.
Figure 13:
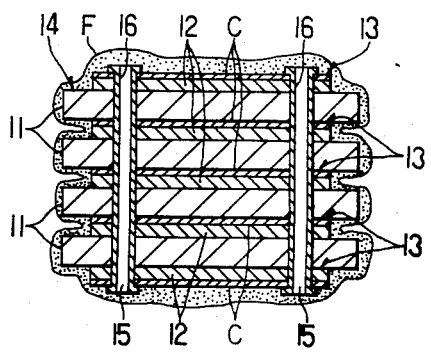
FIG. 13 is a side elevational view shown in vertical section of the so processed single multilayer circuit processed board finally processed with a flux coated all therearound.

Subsequently as shown in FIG. 12, an electrical conductor 16 is applied to the inner faces of the holes 15 and the peripheries thereof. This process may include plating copper on the inner faces of the holes or filling the holes 15 with a silver paste or a copper paste, and then the resist R is removed from the board 14. Thus the laminated circuits 13 of the single board 14 are made electrically conductive to each other, and a single multilayer printed-circuit board 14 produced. Finally as shown in FIG. 13, the multilayer printed-circuit board 14 is protected with a resinous or imidazole flux F coated all over the board.

In short, according to this embodiment, an electrically conductive copper paste is printed on the faces of electrically insulated base plates to form electrically conductive circuits thereon and a copper is plated on the circuits to finish up the latter which are to be laminated to provide a single multilayer printed-circuit board. The multilayer printed-circuit board produced in this method has an excellent property compared to that of the product produced in the conventional copper lamination etching method, and moreover produced more easily, more quickly and at a lower cost.

Further embodiments, variations and modifications of the present invention will be apparent from the foregoing description to those who are skilled in the art.

What is claimed is:

1. A method for producing a multilayer printed-circuit board using an electrically conductive copper paste including 70–85% by weight of copper powder, 15–30% by weight of at least one resin selected from the group of phenol resin, epoxy resin, polyestel resin and xylene resin, and a specific additive selected from anthracene and the derivative thereof, the method comprising the steps of:

Printing the electrically conductive copper paste in a desired circuit pattern on at least one side of each of a predetermined number of electrically insulated prepreg base plates of epoxy resin;

drying the base plates by heating the base plates at approximately 80° C. for approximately 30 minutes to harden the base plates and the copper paste;

laminating the base plates by pressing the base plates together and heating the base plates at approximately 170° C. for approximately 30–60 minutes to additionally harden and fixedly attach the base plates to each other and thereby form a single multilayer printed-circuit board; and electrically connecting the multilayer printed circuits of the multilayer printed-circuit board.

2. A method for producing a multilayer printed-circuit board using an electrically conductive copper paste including 70–85% by weight of copper powder, 15–30% by weight of at least one resin selected from the group of phenol resin, epoxy resin, polyestel resin and xylene resin, and a specific additive selected from anthracene and the derivative thereof, the method comprising the steps of:

printing the electrically conductive copper paste in a desired circuit pattern on at least one side of each of a predetermined number of electrically insulated prepreg base plates of epoxy resin;

drying the base plates at a first predetermined temperature for a first predetermined period of time to harden the base plates;

laminating the base plates and pressing the base plates at a second predetermined temperature a second predetermined period of time to additionally harden and laminate the base plates into a single multilayer printed-circuit board;

forming holes to extend through the single multilayer printed-circuit board in the direction of the thickness from the top to the bottom thereof;

masking all surfaces of the board with a resist except for the surfaces of the holes through the board;

processing the inner surfaces of the holes with an electrically conductive element to electrically connect the multilayer printed circuits of the board;

removing the resist from the single multilayer printed-circuit board; and coating all surfaces of the single multilayer printed-circuit board with a flux;

said first predetermined temperature being approximately 80° C., said second predetermined temperature being approximately 170° C., said first predetermined period of time being approximately 30 minutes and said second predetermined period of time being approximately 30-60 minutes.

* * * * *